United States Patent [19]

Doscher

[11] Patent Number: 5,098,594

[45] Date of Patent: Mar. 24, 1992

[54] CARBONATE/DIESTER BASED SOLVENT

[75] Inventor: Patrisha A. Doscher, Kent, Wash.

[73] Assignee: The Boeing Company, Seattle, Wash.

[21] Appl. No.: 605,630

[22] Filed: Oct. 30, 1990

Related U.S. Application Data

[63] Continuation-in-part of Ser. No. 354,529, May 19, 1989, abandoned, which is a continuation-in-part of Ser. No. 196,903, May 20, 1988, Pat. No. 5,007,969.

[51] Int. Cl.$^5$ .................. B08B 3/08; C09D 9/02; C11D 7/50
[52] U.S. Cl. .................... 252/162; 252/170; 252/171; 252/153; 252/364
[58] Field of Search ............... 252/162, 170, 171, 153, 252/364

[56] References Cited

U.S. PATENT DOCUMENTS

| | | | |
|---|---|---|---|
| 2,932,618 | 4/1960 | Oberdorfer | 252/143 |
| 2,935,479 | 5/1960 | Oberdorfer | 252/70 |
| 3,150,048 | 9/1964 | Hollub | 252/170 |
| 3,382,181 | 5/1968 | Oberdorfer | 252/364 |
| 3,796,602 | 3/1974 | Briney | 134/42 |
| 4,508,634 | 4/1985 | Elepano | 252/163 |
| 4,617,251 | 10/1986 | Sizensky | 430/526 |
| 4,645,617 | 2/1987 | Vivian | 252/165 |
| 4,680,133 | 7/1987 | Wand | 252/153 |
| 4,781,916 | 11/1988 | papaphilippou | 252/162 |
| 4,822,723 | 4/1989 | Dhillon | 430/331 |

Primary Examiner—A. Lionel Clingman
Assistant Examiner—William S. Parks
Attorney, Agent, or Firm—John C. Hammar

[57] ABSTRACT

Solvents having superior cleaning power include at least one polar compound having at least one strongly electro-negative oxygen, such as ethylene diacetate, and at least one alicyclic carbonate, such as ethylene carbonate, with or without other additives. The solvents exhibit low toxicity; are nonflammable, pH neutral, essentially nonvolatile, and aprotic; and have other chemical and physical properties that reduce the risk of exposing the user unnecessarily to hazardous conditions. Solvents comprising ethylene carbonate, ethylene diacetate, and, optionally, triethanolamine (TEA) and/or N-methyl-2-pyrrolidone (NMP) are superior cleaners for a wide range of residues and are environmentally and physiologically safe, and may be diluted with water for cleaning tasks that are insensitive to corrosion.

42 Claims, No Drawings

CARBONATE/DIESTER BASED SOLVENT

REFERENCE TO RELATED APPLICATIONS

This application is a continuation-in-part application based upon U.S. patent application Ser. No. 07/354,529, now abandoned, filed May 19, 1989, which is a continuation-in-part application based upon U.S. Pat. application Ser. No. 07/196,903, now U.S. Pat. No. 5,007,969, filed May 20, 1988.

TECHNICAL FIELD

The present invention relates to liquid organic solvents, and, more particularly, to aprotic solvents designed to replace MEK and other hazardous solvents presently in widespread use.

BACKGROUND OF THE INVENTION

Solvent cleaning is generally accomplished today using a variety of highly or moderately toxic or corrosive solvents. Because of the growing concerns for personal safety and health and for the environment, federal and state governments are promulgating increasingly stringent compliance criteria for solvent manufacturers and users to ensure the health and safety of those working with and around such solvents and to ensure environmentally-sound disposal of wastes that are created. For instance, California limits the use of volatile solvents by requiring that they have a vapor pressure below about 45 mm Hg at 20° C. For many users, disposal (because the wastes are hazardous) generally translates into significantly increased costs that are not reflected in the material cost for the solvent.

Although personal safety can be promoted primarily by preventing direct contact and exposure to hazardous solvents or by limiting exposure below published thresholds, such precautions do not account for accidents or individual sensitivities. The flammability, volatility, cleaning ability, stability during storage, and odor are other factors that the user must also consider in choosing a particular solvent.

One solvent that has found widespread application in industrial applications is methylethylketone (MEK). Although MEK is generally considered a satisfactory solvent from a cleaning effectiveness standpoint, there is a growing concern that the toxicity and flammability of MEK exposes users to unnecessary risks. Its volatility raises environmental concerns, especially in areas where photochemical smog is a problem. Moreover, the expense associated with the safe disposal of MEK wastes is often about 5 to 10 times the material cost for MEK, thereby making MEK an expensive solvent to use.

Increasing efforts are being devoted to developing substantially nontoxic solvents that exhibit low flammability, low volatility, and superior cleaning ability over a wide range of debris; have a pleasant odor or are odorless; are stable during storage; and are readily disposable or recoverable. Such solvents will be safe to use not only in large scale industrial applications, but also on the much smaller scale encountered in every day household cleaning chores.

SUMMARY OF THE INVENTION

The solvent of the present invention generally is aprotic, exhibits low toxicity and low volatility, and provides superior cleaning ability, thereby meeting or exceeding the new environmental and safety criteria for solvents. The solvent generally includes a mixture of an alicyclic carbonate (particularly a mixture of ethylene carbonate and propylene carbonate) and a polar compound having at least one strongly electronegative oxygen and selected from the group consisting of alkyl diethers, alkyl diesters, alkyl compounds containing both ester and ether groups, and mixtures thereof. Ethylene carbonate, normally a solid at room temperature, but it dissolves in the polar compound and propylene carbonate and remains stable to temperatures far below its normal freezing point. A preferred polar compound is ethylene diacetate. The polar compound, therefore, forms a liquid mixture at room temperature with the alicyclic carbonate by depressing its freezing point.

The solvent of the present invention can be combined with other additives to form further improved solvents, for example, to reduce the surface tension of the solvent; to increase its ability to clean greases, oils or other residues; or to reduce its aggressiveness for acrylics or other solvent-sensitive plastics. Preferred additives include triethanolamine (TEA) or N-methyl-2-pyrrolidone (NMP).

The solvent effectively removes residues (such as oils, greases, epoxy resins, organic adhesives, waxes, photoresist, inks, fingernail enamel, or non-polymeric paints or coatings, particularly evaporative drying finishes (like shellac, lacquer, or varnish) from solid substrates including wood, plastic, metal, or ceramics.

The preferred aprotic solvent is essentially nonflammable and has a vapor pressure that is well below the allowable maximum that governmental agencies have contemplated for or established (as a compliance standard). The nonhazardous nature of the solvent reduces or eliminates apprehension that users normally associate today with the use of the conventional solvents that have recently been drawn into question. The preferred solvent of the present invention, thus is virtually odor free and stable under storage conditions. Further, the increasing costs normally associated with the disposal of toxic or hazardous substances are circumvented or reduced because the debris-filled solvent of the present invention can be recovered or disposed of by less costly means than are required for hazardous wastes. Being aprotic, it is noncorrosive.

The solvent can also include minor proportions of a nonionic wetting agent of the formula:

$$C_9H_{19}\text{—}\phi(OCH_2CH_2)_{12}OH$$

Generally this wetting agent is added in volumes of about 5-10% to the carbonate/polar solvent mixture with or without the TEA or NMP additives. The wetting agent also is preferred for use in a solvent that includes only one of ethylene carbonate or propylene carbonate rather than both.

When corrosion is not a significant factor to guard against, the solvent can be diluted with water (as much as nine volumes of water to that of organic solvent; i.e., a final mix of 90% water) and still be an effective cleaner. In this diluted condition, the preferred aqueous solvents contain:
  ethylene carbonate;
  ethylene diacetate and/or ethylene dibutyrate;
  optionally, TEA;
  optionally, NMP;
  optionally, nonionic wetting agent; and water
A most preferred solvent comprises about:

about 35 vol % ethylene carbonate;
about 35 vol % ethylene diacetate;
about 10 vol % nonionic wetting agent; and
about 20 vol % ethylene dibutyrate
and, optionally, can be diluted with between about 75-90 vol % water. Again, either the aprotic or aqueous solvents can also include TEA or NMP, generally added as 5-10 vol % of the initial volume of ethylene carbonate and ethylene diacetate.

DETAILED DESCRIPTION OF THE INVENTION

A particularly effective aprotic, liquid solvent that exhibits low toxicity and low volatility is provided by a mixture of an aliphatic carbonate and a polar compound having a strongly electronegative oxygen and selected from the group consisting of alkyl diethers, alkyl diesters, alkyl compounds containing both ester and ether groups, and mixtures thereof.

Preferably the aliphatic carbonate is a mixture of saturated, cyclic hydrocarbons, particularly a mixture of alicyclic carbonates such as an equivolume mixture of ethylene carbonate and propylene carbonate. Diesters are preferred for the polar compound over either diethers or ether/esters.

If the solvent is aprotic, it will be noncorrosive to metal substrates. This criterion is particularly important for aerospace applications where aluminum is used to reduce weight but where its integrity is highly dependent upon being free from corrosion. By "aprotic," we mean that the solvent lacks compounds that are readily able to donate or lose a proton, such as organic acids, and that are not readily able to accept a proton. We have found that alcohols can often be used without significantly increasing the corrosiveness of the solvent. The alcoholic hydroxyl group is aprotic.

The solvent has low toxicity to promote its utility as a cleaner in handwipe situations and to reduce its overall costs. Hazardous or toxic wastes are a major environmental concern and require extraordinary handling for safe disposal.

The preferred solvent has low volatility for both the safety of the workers and the environment, generally lower than 1 mm Hg at 20° C.

A mixture of ethylene diacetate and ethylene carbonate in all proportions, but preferably substantially a eutectic composition of between about 50-60 vol % (and preferably 50-55 vol %) ethylene diacetate, provides a liquid solvent with a superior combination of properties. We designate this mixture "MOK." Generally, mixtures of this type exhibit a freezing point depression for the ethylene carbonate component, and are liquids at ambient temperature. For instance, ethylene carbonate normally freezes at about 36.4° C. When mixed with ethylene diacetate or the other polar compounds of the present invention, however, the resulting mixture is a liquid at or below ambient temperatures (i.e., about 20° C.). Being a liquid at ambient temperatures makes the solvent easily usable in most industrial cleaning applications where the carbonate, normally being a solid, otherwise would be difficult or impossible to use.

The polar compounds which are useful in the present invention are generally of the type that include at least one (and generally two) strongly electronegative oxygen (generally a carbonyl) capable of complexing in solution with the alicyclic carbonate and of dissolving debris or residues during cleaning. In solution, we believe that the affinity between the electronegative oxygens of the polar compound and the alicyclic carbonate is stronger than the affinity between adjacent alicyclic carbonate molecules. Thus, the polar compounds are able to complex with the alicyclic carbonates under conditions at which the alicyclic carbonate otherwise would be a solid. This belief is supported by consideration of hydrogen bonding (and its resulting stabilizing energy) that is promoted by the polar compound.

The polar compound preferably is selected from alkyl diesters, alkyl diethers, or alkyl compounds containing both an ester and an ether group, or mixtures thereof. Each polar compound of this type actually has at least two strongly electronegative oxygens. The most preferred polar compounds are the alkyl diesters and alkyl diethers which are symmetric or nearly symmetric. Examples of these symmetric polar compounds include ethylene diacetate, ethylene dibutyrate (i.e., alkylene dialkylates), ethylene glycol diethyl ether, ethylene glycol dimethyl ether (i.e., alkylene glycol dialkyl ethers), butyl diglycol carbonate, and dimethyl glutarate. A preferred symmetric polar compound is ethylene diacetate. This molecule is charaterized by a plane of symmetry through the central C—C bond:

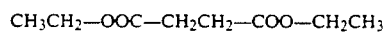

$$CH_3CH_2-OOC-CH_2CH_2-COO-CH_2CH_3$$

Although asymmetric compounds may be used, the symmetric polar compounds are preferred because of their stronger electronegative oxygens compared to the electronegativity of the oxygens in the asymmetric compounds. Examples of asymmetric polar compounds include ethylene glycol monoacetate and ethyl-3-ethoxypropionate. Preferably, the polar compound is saturated so that the oxygens are free to rotate, thereby enabling them to complex readily with (through hydrogen bonding) or to dissolve both the alicyclic carbonate and the residue.

Ketones are also candidates for the polar solvent, although we prefer ethylene diacetate for its overall properties.

The aprotic solvent of the present invention generally includes a mixture of both ethylene carbonate and propylene carbonate and a dipolar alkyl diether or diester which combines an exposed (carbonyl) oxygen on the alicyclic carbonates with the solvent properties of the dipolar diether or diester, particularly the double carbonyls of the symmetric dieter, ethylene diacetate.

As will be illustrated, in part, in the examples, compounds having at least two electronegative oxygens (especially diesters) are preferred and outperform single esters or ethers. First, symmetry of the carrier solvent is lost in a single ester and the single ester is not as effective as dissolving the ethylene carbonate. Second, fewer sites are available for hydrogen bonding with either the carbonate or the residue and solvency (cleaning power is lost).

Throughout this specification, "residue" is used to refer to the material upon which the solvent acts to affect the desired cleaning. "Residue" is often used interchangeably with "debris."

The preferred solvent of ethylene carbonate and ethylene diacetate, nevertheless, suffers in its cleaning ability for greases and oils, which, we believe occurs principally because the solvent lacks any significant lipophilic elements. That is, the diacetate and carbonate lack any saturated hydrocarbon segments of appreciable length or MW, and neither, accordingly, resemble oils. Therefore, for removal of greases and oils, without significant degrading of the important and advantageous toxicological and environmental properties of the solvent, ethylene dibutyrate can be substituted for the ethylene diacetate or used in conjunction with it (up to about 25 vol %) to provide an adequate and improved degreaser. Alternatively, triethanolamine (TEA) and N-methyl-2-pyrrolidone (NMP) in about 5-10 vol % proportions can be used together or separately with the ethylene carbonate/ethylene diacetate mixture to remove greases. We have found ethylene dibutyrate, TEA, and NMP to be beneficial additives using as little as 5 vol % of the additive and the remainder the eutectic mixture of the preferred solvent. A mixture of 5 vol % TEA/or 5 vol % NMP and the remainder MOK or ethylene carbonate/propylene carbonate/ethylene diacetate has broad solvency with relatively low surface tension and outstanding aggressiveness for residues, including nonpolar species. This latter three component mixture, which we designate "MOK II," generally includes equal volumes of the two carbonates mixed with two volumes of diacetate (i.e. 25:25:50 on a volumetric basis). The solvents of the present invention are among the best and most versatile solvents we have tested, and they satisfy the most stringent environmental and safety criteria.

Other lipophilic additives (as will be discussed) can be added to the solvents to further enhance their utility.

Aggressiveness and cleaning power for removing or softening polymeric paints can be achieved by using MOK or MOK II in conjunction with a low molecular weight organic acid, such as formic or acetic acid, and, particularly, about 50 vol % glacial acetic acid, but this solution is not preferred for general application. The introduction of an acid eliminates the aprotic character of the solvent, and potentially limits the uses of the resulting mixtures. For stripping polymeric paints, such as epoxies, however, we have found the acetic acid-/ethylene carbonate/ethylene diacetate mixture to be effective. Evaporative finishes (such as varnish, lacquer, or shellac) can be stripped with the preferred solvent alone. Acrylic paints commonly used in the automotive industry are also stripped readily with the eutectic mixture alone.

Ethylene diacetate is a colorless liquid that exhibits a faint odor and is soluble in water in amounts up to about 10%. The boiling point of ethylene diacetate is 190.5° C., and its freezing point is −41.5° C. The vapor pressure exhibited by ethylene diacetate at 20° C. is 0.3 mm Hg and its flashpoint is 96.4° C. Ethylene diacetate is generally considered a low-toxicity solvent for solvent-sensitive materials, such as cellulose esters and ethers, resins, lacquers, and printing inks.

Ethylene carbonate, the preferred alicyclic carbonate, is an essentially colorless, odorless solid with a freezing point of 36.4° C., a boiling point of 248° C., and a flashpoint of 143.7° C. Ethylene carbonate is miscible with water, alcohol, ethyl acetate, benzene, and chloroform and is soluble in ether, n-butanol, and carbon tetrachloride. Ethylene carbonate is generally considered a low toxicity solvent for dissolving many polymers and resins.

Another useful alicyclic carbonate is propylene carbonate, which, like ethylene carbonate, is odorless and colorless. Its freezing point is −49.2° C.; its boiling point, 241.7° C.; and its flashpoint, 132.5° C. Propylene carbonate is miscible with acetone, benzene, chloroform, ether, and ethyl acetate is moderately soluble in water and carbon tetrachloride. Ethylene carbonate is the preferred alicyclic carbonate because the electronegativity of its exposed oxygen is greater than that of propylene carbonate or other higher alicyclic carbonates. Mixtures of ethylene and propylene carbonate might be used to reduce the aggressiveness of the resulting solvent in particular applications.

The electronegativity of the oxygen-containing groups of the polar compound in combination with the electronegativity of the carbonate group in the alicyclic carbonate apparently enables the solvent of the present invention to exhibit its superior cleaning ability. Molecular interactions between the solvent and the residue involves varying degrees of van der Waals forces or hydrogen bonding. These interactions are generally stronger than the molecular interactions between molecules of the residue or between the residue and the substrate. We believe that this stronger molecular interaction and affinity between the solvent and residue enables the solvent to remove the residue.

Preferably the polar solvent has at least one carbonyl oxygen, and generally it has two.

One preferred solvent of the present invention, thus, includes between about 40 to 95 parts by volume ethylene diacetate with the remainder ethylene carbonate. The preferred mixtures are liquids at or around room temperature, i.e., 20° C. The amounts of ethylene diacetate and ethylene carbonate, within the above range, will be varied primarily upon consideration of the particular cleaning task. If the material to be removed is more soluble in ethylene diacetate than ethylene carbonate, then, the concentration of the diacetate should predominate to the extent allowed within the delineated range. The converse is similarly true. A preferred mixture includes between about 50 to about 60 parts by volume ethylene diacetate and remainder ethylene carbonate. The 40-95 percent range is preferred for room temperature uses. At higher cleaning temperatures, any proportions of ethylene diacetate and ethylene carbonate that provide a liquid at the use temperature are probably acceptable.

The eutectic composition, is essentially between about 50-55 vol % diacetate and the remainder carbonate and is desirable in many industrial cleaning applications because it allows consistent performance and retention of properties even if open tanks are used, since the composition remains constant.

As the temperature of the diacetate/carbonate mixture is lowered, the alicyclic carbonate will solidify out of the mixture until the eutectic composition is reached at which point both components will solidify simultaneously as a constant composition. Therefore, the eutectic composition has several advantages related to the handling and cleaning or reclaiming of the solvent. For instance, since the eutectic composition solidifies and vaporizes at a constant composition (the mixture also being an azeotrope), it may easily be separated and recovered from other components, like the residue or other debris, by vacuum distillation or zone recrystallization (wherein the solvent is frozen, for example, from a mixture of the solvent, residue, and a recovery fluid). Solvent extraction (even using water, if desired) is another useful method to reclaim and clean the solvent. The spent solvent, filled with residue, can usually be buried or otherwise disposed of by conventional means without special precaution or the fear of generating hazardous wastes, if reclaiming it is not an economical option.

As described earlier, the carbonate/diacetate solvent of the present invention can also include other additives that are used to address specific cleaning problems. The selection of the particular additives and the amounts used should generally be consistent with the objective of providing an aprotic solvent with a low vapor pressure that is essentially nonflammable, odorless, and nontoxic. For example, relatively high MW, saturated alcohols (such as decanol), sulfonated amines, or ethyl-3-ethoxypropionate may be added in small proportions as surfactants to decrease the surface tension of the solvent mixture. Further, propylene glycol or a related additive can be used to dilute the solvent to reduce its power or aggressiveness, for example, for acrylics.

Moderate to high molecular weight alcohols or esters, especially the fatty acid esters (such as lanolin), the fatty acid alcohols (such as beeswax), or other $C_8$ through $C_{20}$ alkyl alcohols, ethylene dibutyrate or other higher ethylene dialkylates, triethanolamine (TEA), N-methyl-2-pyrrolidone (NMP), or other additives that are lipophilic can be used to enhance the ability of the solvent to clean greases or oils.

When the lipophilic additive is a fatty acid ester or alcohol, it may be necessary to dissolve the additive in a low molecular weight alcohol, such as denatured ethanol, prior to adding it to the eutectic mixture. Because denatured ethanol has a toxicity greater than the preferred components, it is desirable to minimize the amount used.

Ethylene dibutyrate as a substitute for the diacetate or in conjunction with it or TEA are preferred lipophilic additives.

A particularly preferred solvent with superior environmental, safety, and cleaning properties is about 5 vol % TEA, about 5 vol % of NMP, and the remainder essentially a eutectic mixture of ethylene carbonate and ethylene diacetate (i.e., MOK). This solvent is an excellent handwipe solvent that cleans a broad range of residues effectively, even nonpolar residues. While the ratio of TEA and NMP can be varied in such a solvent, we prefer to have equal volumes of TEA and NMP, because we believe we achieve the best cleaning properties. Because both TEA and NMP are relatively expensive, we attempt to minimize their use. Five vol % of each with the eutectic mixture has proven to be a superior solvent.

For mixtures that contain both TEA and NMP, as described above, it is important to form the mixture just before the intended use. These mixtures have a relatively short shelf life. Delay in use can lead to deleterious reaction between the mixture components, but use soon after mixing at ambient temperatures does not appear to be problematical.

When using a multicomponent mixture (i.e., the alicyclic carbonate, the polar compound, and additives), it is advantageous to use the eutectic mixture of the carbonate and polar compound. Otherwise, the multicomponent mixture's strength and properties might change significantly during use and recovery.

Differential scanning calorimetry analysis of MOK shows that certain proportions of ethylene diacetate and ethylene carbonate exhibit a distinct exotherm at temperatures ranging from about $-38°$ C.

Although the reason an exotherm occurs is not fully understood, we believe that an exotherm indicates a nucleation of the diacetate and carbonate associated with the formation of a eutectic mixture. Strong molecular interaction occurs when enough energy is put into the system to allow molecular orientation of the diacetate and carbonate into a unique semicrystalline state and, we believe, prevents the individual components (particularly the carbonate) from behaving independently, complexing, and solidifying.

For higher relative concentrations of ethylene diacetate, no exotherms occur, which is believed to be a result of the dominating effect the excess ethylene diacetate has on the solvent mixture. That is, although nucleation is occurring between the carbonate and diacetate molecules, the effect is masked in the differential scanning calorimeter by the excess diacetate.

The preferred solvents of the present invention generally have vapor pressures that are less than about 1 mm Hg at 20° C., which means that, at ambient conditions, the user will not be exposed unnecessarily to large amounts of solvent vapor and the atmosphere will not be contaminated by the escaping hydrocarbons. Conventional solvents having higher vapor pressures are, by definition, much more volatile. Further, the low vapor pressure of the mixtures translates into a decreased flammability risk, as well as virtually removing the risk of auto-ignition of the solvent vapors. In fact, the preferred solvent of diacetate and carbonate has a flashpoint greater than about 93.7° C. and would be categorized as noncombustible liquids according to OSHA standards. Both TEA and NMP, the preferred additives, also have low vapor pressures.

MOK (without additives) is essentially odorless, is substantially neutral based on ASTM-D1093 for measuring pH, and does not exhibit photochemical reactivity. In this last respect, the solvents of the present invention are a distinct improvement over conventional olefinic or aromatic solvents, particularly with respect to the environmental consequence of initiating or enhancing photochemical smog. It does not impact stratospheric ozone as chlorofluorocarbons (CFCs) do. Another advantage of the solvent of the present invention is its relatively high boiling temperature that allows the solvent to be used in heated baths or as a hot mixture without significant evaporation. We have found that immersing circuit boards coated with photoresist into an agitated, heated bath of the preferred solvent for several minutes is a simple and quick way to strip the photoresist. Generally, the solvent bath is heated to a temperature of about 100° F. (37° C.) and immersion occurs for about five minutes. Heat in this application generally results simply from the input of ultrasonic energy to provide the agitation.

MOK exhibits moderate solubility in water, but is not believed to be hygroscopic. The moderate solubility is advantageous because, when applied to a metals such as aluminum, the mixture will not contain excessive water. Risk of corrosion is reduced. Further, MOK can be recovered by decanting it from water, especially when water is used to rinse the solvent from the cleaned substrate.

The solvent can also include minor proportions of a nonionic wetting agent of the formula:

available from GAF under the trademark "AGUET." Generally this wetting agent is added in volumes of about 5-10% to the carbonate/polar solvent mixture with or without the TEA or NMP additives. The wetting agent also is preferred for use in a solvent that includes only one of ethylene carbonate or propylene carbonate rather than both.

When corrosion is not a significant factor to guard against, the solvent can be diluted with water (as much as nine volumes of water to that of organic solvent; i.e., a final mix of 90% water) and still be an effective cleaner. In this diluted condition, the preferred aqueous solvents contain:
water
ethylene carbonate;
ethylene diacetate and/or ethylene dibutyrate; and
optionally, any or all of TEA,
NMP, and a nonionic wetting agent
For example, such a solvent can comprise about:
35 vol % ethylene carbonate;
35 vol % ethylene diacetate;
10 vol % nonionic wetting agent; and
20 vol % ethylene dibutyrate
and, can be diluted with between about 3-9 volumes of water to leave a mixture that is about 75-90 vol % water. Again, either the aprotic or aqueous solvents can also include TEA or NMP, generally added as 5-10 vol % of the initial volume of ethylene carbonate and ethylene diacetate.

In all these solvents, the proportion of ethylene carbonate can be replaced with a 50:50 mixture of ethylene carbonate and propylene carbonate. In most applications we prefer such a substitution.

Mixtures of ethylene carbonate and ethylene diacetate (or other allyldiesters) usually are made up by adding liquified ethylene carbonate to the ethylene diacetate while stirring. Heating the mixture for a short time is recommended to ensure disassociation of the carbonate molecules and subsequent association with the diacetate. A preferred method for making up and stabilizing MOK was developed by Dennis McCain and involves heating the mixture at about 138° F. for five minutes while stirring. Solid ethylene carbonate can be added, but it must then dissolve. The mixture is generally stable at room temperature when sealed.

The solvent can be applied with a cleaning rag or brush prior to scrubbing or it may be sprayed on. A part coated with residue can also be immersed in a bath of the solvent, as previously described, where ultrasound or other means are used to agitate the bath to speed the removal of the residue. Immersion cleaning is particularly useful for removing photoresist from circuit boards. Vapor degreasing techniques can also be used by condensing the solvent on the substrate from a vapor, although vaporizing the solvent can be costly from an energy standpoint. The amount of solvent used and the contact time required in any cleaning technique depends on the nature of the residue and the specific composition of the mixture.

Solvents of the present invention can be used as general purpose solvents for polar and nonpolar residues, such as those generally encountered in the aerospace and electronics industries. Some solvents are also effective fingernail enamel removers and are not as harsh as conventional, commercial enamel removers.

The cleaning power of MOK may be best understood with reference to the following examples which are presented to illustrate features of the present invention:

EXAMPLE 1

Test panels made from 2024-T3 aluminum alloys were alodined, primed with an epoxy primer, and coated with a residue as specified in TABLE 1. A candidate cleaner was squirted onto the panel and removed with a cleaning rag by hand. A second set of test panels used a glass plate coated with the same residues as used on the alodined aluminum. Cleaning effectiveness was evaluated visually (with a 10 power microscope for the glass slides) according to the following key:
0 = no effect on residue
1 = slight effect on residue
2 = removes residue almost completely with rubbing and dwell time
3 = removes residue completely with rubbing and dwell time
4 = removes residue completely with rubbing
5 = removes residue completely by pooling up prior to wiping off
+ = visibly affects paint The candidate cleaners (all of which meet basic environmental and health considerations) tested included:
1. 46 vol % ethylene carbonate and 54 vol % ethylene diacetate (i.e., MOK)
2. Hot ethylene carbonate
3. Ethylene diacetate
4. 2-Ethylhexyl acetate
5. Ethyl-3-ethoxypropionate
6. Triacetin
7. Propylene carbonate
8. 1,2-Propylene glycol
9. Tap water.

The result of these cleaning experiments are set forth in TABLE 1.

Terpineol is an unsaturated hydrocarbon, a factor virtually eliminating it from serious consideration. We tested it anyway in accordance with the method of Example 1 and determined that it had poor cleaning power. MEK was tested for purposes of comparison. It is the benchmark solvent that the solvent of the present invention is designed to replace. The results for terpineol and MEK are also set forth in TABLE 1.

The solvent of the present invention cleans as well or better than the other solvents tested. Although removal of labels was difficult, the solvent exhibited essentially universal cleaning power for the residues tested, thereby increasing its potential for industrial use where universality is highly preferred over specificity. Notably the solvent of the present invention had little or no effect on polymeric (epoxy) paint, thereby making it a good candidate for cleaning paint sealed surfaces dirtied with other residues.

TABLE 1

| Cleaner | Residue | CLEANING EFFECTIVENESS | | | | | | | |
|---|---|---|---|---|---|---|---|---|---|
| | | Chem Mill Oil | Ink (Sharpie) | Writing Ink | COSMOLINE | Ketchup | Lipstick | Labels | Paint |
| 1. | Ethylene Carbonate/ Ethylene Diacetate | 5 | 5 | 5 | 5 | 5 | 5 | 3 | 0 |
| 2. | Hot Ethylene Carbonate | 4 | 5 | 5 | 0 | 3 | 5 | 1 | 0 |
| 3. | Ethylene Diacetate | 5 | 5 | 5 | 0 | 3 | 5 | 1 | 0 |
| 4. | 2-Ethylhexyl Acetate | 5 | 5 | 4 | 0 | 2 | 5 | 1 | 0 |

TABLE 1-continued

| Cleaner | Residue | CLEANING EFFECTIVENESS | | | | | | | |
|---|---|---|---|---|---|---|---|---|---|
| | | Chem Mill Oil | Ink (Sharpie) | Writing Ink | COSMOLINE | Ketchup | Lipstick | Labels | Paint |
| 5. | Ethyl-3-Ethoxypropionate | 4 | 5 | 5 | 5 | 2 | 3 | 5 | + |
| 6. | Triacetin | 4 | 1 | 0 | 5 | 4 | 4 | 0 | 0 |
| 7. | Propylene Carbonate | 5 | 5 | 4 | 0 | 3 | 5 | 0 | 0 |
| 8. | 1,2-Propylene Glycol | 0 | 5 | 4 | 0 | 3 | 5 | 0 | 0 |
| 9. | Tap Water | 0 | 0 | 0 | 0 | 1 | 0 | 0 | 0 |
| 10. | Terpineol | 0 | 1 | 1 | 4 | 4 | 2 | 3 | 0 |
| 11. | Methylethylketone | 5 | 5 | 5 | 5 | 2 | 2 | 5 | + |

COSMOLINE is a trademarked corrosion inhibitor of E. F. Haughton

EXAMPLE 2

Plastic panels made from the resins listed in TABLE 2 were immersed in the listed solvents for a period of 168 hours (one week) to test the effect of the solvents on the plastic. The results were visually observed and recorded according to the following key:

+ + = major effect
+ = some effect
− = no effect

The solvents tested were:
1. MOK (an in Example 1)
2. Propylene carbonate
3. Ethylene diacetate
4. 2-Ethylhexyl acetate
5. 1,2-propylene glycol
6. Ethyl-3-ethoxypropionate
7. Triacetin
8. Terpineol MOK did not adversely affect any plastic substrate tested. While MOK does attack solvent-sensitive plastics (principally through its diacetate component), it is usable on nearly all high performance composites, thereby making it usable in aerospace applications. MEK is known to attack engineering plastics.

TABLE 2

| | | EFFECT ON PLASTIC | | | | | |
|---|---|---|---|---|---|---|---|
| Cleaner | Resin | Acrylic-Lucite | Polycarb/Lexan | PTFE/Teflon | PVF/Tedlar | Mylar | Fiber/Epoxy Composite |
| 1. | Ethylene Carbonate/Ethylene Diacetate | − | − | − | − | − | − |
| 2. | Propylene Carbonate | − | − | + | − | − | − |
| 3. | Ethylene Diacetate | − | − | − | − | − | − |
| 4. | 2-Ethylhexyl Acetate | − | − | − | − | − | − |
| 5. | 1,2-Propylene Glycol | − | − | − | − | − | − |
| 6. | Ethyl-3-Ethoxypropionate | + | − | − | − | − | − |
| 7. | Triacetin | − | − | − | − | − | − |
| 8. | Terpineol | − | − | − | − | − | − |

| Cleaner | Resin | Aramid/Kevlar | ABS/Royalite 50 | Poly-Sulfone Royalite 520 | PVC | Poly-acetal | Phenolic | Nylon |
|---|---|---|---|---|---|---|---|---|
| 1. | Ethylene Carbonate Ethylene Diacetate | − | − | − | − | − | − | − |
| 2. | Propylene Carbonate | − | + | − | − | − | − | − |
| 3. | Ethylene Diacetate | − | + | − | − | − | − | − |
| 4. | 2-Ethylhexyl Acetate | − | + | − | − | − | − | − |
| 5. | 1,2-Propylene Glycol | − | − | − | − | − | − | − |
| 6. | Ethyl-3-Ethoxypropionate | − | + + | − | + | − | − | − |
| 7. | Triacetin | − | − | − | − | − | − | − |
| 8. | Terpineol | − | − | − | − | − | − | − |

EXAMPLE 3

MOK was tested for its effectiveness in removing Kodak KPR3 TM and DuPont RISTON TM photoresist and Kodak Thin Film Resist (KTFR TM) from electronic circuitry equipment by contacting the photoresist and etch resist with the solvent. The solvent mixture removed KPR3 TM and RISTON TM photoresist effectively upon 30 minutes of soaking without scrubbing. The removal was accelerated by heating the solvent. The solvent performed poorly on the Kodak Thin Film Resist after a similar treatment, and may not be a suitable solvent for this residue.

EXAMPLE 4

A mixture of ethylene diacetate and ethylene carbonate was applied to an evaporative wood finish (i.e., varnish, lacquer, or shellac) and allowed to stand for several minutes to soften the finish. Upon wiping, the coating was easily removed.

EXAMPLE 5

A multicomponent mixture of ethylene diacetate, ethylene carbonate, and triethanolamine (TEA), was prepared by mixing about 5-10 parts by volume TEA with about a 50:50 vol % mixture of ethylene carbonate and ethylene diacetate. This mixture was then applied to a greasy residue comprising MIL-L-7870 oil on the surface of aluminum (or an alloy) and removed with a cleaning rag. The grease was essentially completely removed with mild rubbing.

The multicomponent mixture cleaned this greasy surface more effectively than a simple mixture of ethylene diacetate and ethylene carbonate presumably because the triethanolamine, being a lipophilic additive, complexed with the grease to assist the carbonate and diacetate to remove it.

The multicomponent mixture exhibited the following chemical and physical properties:
vapor pressure: <1 mm Hg at 20° C.;
essentially colorless and odorless; and
essentially nonflammable.
While we believe that other trialkylamines would also prove effective for this purpose, we prefer to use TEA for its convenience (insofar it is readily available commercially), its low toxicity, and its low vapor pressure. Because of its cost, however, the amount of TEA used should be minimized.

EXAMPLE 6

In a solvent mixture, up to about 25 parts by volume ethylene dibutyrate were added to a mixture of the preferred diacetate/carbonate solvent of Example 5 to increase the lipophilic nature of the mixture by doubling the length of the hydrocarbon chains pendent from the carbonyl groups of the diester. The resulting mixture was applied to a greasy substrate following the same general steps as used in Example 5. This mixture was also an improved degreaser, presumably because of the higher molecular weight and chemical properties of the pendent butyrate groups. It is much sounder environmentally to use than the FREON degreasers (CFCs) commonly used today for this same cleaning operation.

EXAMPLE 7

A multicomponent mixture of ethylene diacetate, ethylene carbonate, TEA, and N-methyl-2-pyrrolidone (NMP) was prepared by mixing about 5 vol % TEA and 5 vol % NMP with the remainder about a 50:50 vol % mixture of the carbonate and diacetate. The mixture was tested on MIL-L-7870 oil and found to be a superior cleaner, especially for greases, but having widespread solvency for industrial debris.

EXAMPLE 8

About 5-10 vol % NMP, was mixed with about a 50:50 vol % mixture of carbonate and diacetate. The resulting mixture was tested on MIL-L-7870 oil in accordance with Examples 5 or 7. While an effective cleaner, we prefer the 4-component mixture of Example 7 principally because it is able to achieve superior performance with a smaller amount of expensive NMP than would otherwise be required if TEA were not also included.

EXAMPLE 9

A circuit board coated with Kodak KPR3 photoresist was immersed on a bath of ethylene carbonate and ethylene diacetate in accordance with Example 3. The bath was agitated with ultrasonic energy for several minutes to strip the photoresist from the board.

The present invention, then, provides an aprotic, liquid solvent that is a nontoxic, nonflammable, and an effective alternative to conventional cleaning solvents like MEK, halogenated hydrocarbons (particularly the FREONs), or olefinic or aromatic hydrocarbons. The preferred mixture of ethylene carbonate and ethylene diacetate out performs other environmentally acceptable candidate solvents without harming the substrate, be it ceramic, glass, or plastic. Examples 1 and 2 show that any mixture of ethylene carbonate with ethylene diacetate out performs either ethylene carbonate or ethylene diacetate alone. In its preferred concentrations, the solvent is a suprisingly effective solvent for most industrial cleaning applications, including removal of photoresist.

EXAMPLE 10

A solvent (i.e. MOK II) was prepared using about 25 vol. % ethylene carbonate, 25 vol. % propylene carbonate, and the remainder ethylene diacetate. This solvent had similar cleaning properties to MOK.

EXAMPLE 11

The solvent of Example 10 was mixed with about 5 vol. % TEA and exhibited cleaning properties similar to MOK/TEA solvents.

EXAMPLE 12

The solvent of Example 10 was mixed with about 5 vol. % NMP and exhibited cleaning properties similar to MOK/NMP solvents.

EXAMPLE 13

A solvent was prepared by mixing about 35 vol. % ethylene carbonate, about 35 vol. % ethylene diacetate, about 10 vol. % of a nonionic wetting agent of the formula:

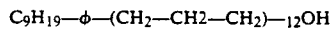

and about 20 vol. % ethylene dibutyrate. The solvent was an effective solvent for several types of industrial debris, similar in performance to MOK, but more effective as a degreaser.

EXAMPLE 14

The solvent of Example 13 was diluted until the mixture was about 75-90 vol. % water and tested on non-metallic, corrosion-resistant substrates. This solvent remained an effective degreaser which was easy to clean up by further water washes.

EXAMPLE 15

The solvent of Example 13 was diluted with about 5 vol. % TEA and exhibited cleaning properties similar to MOK/TEA solvents.

EXAMPLE 16

The solvent of Example 13 was diluted with about 5 vol. % NMP and exhibited cleaning properties similar to MOK/NMP solvents.

EXAMPLE 17

The solvent of claim 14 was diluted with about 5 vol. % TEA and about 5 vol. % NMP to form a highly effective aqueous cleaner.

Similar solvents have been tested without the addition of the wetting agent, and proved to be satisfactory cleaners, although somewhat less desirable for heavy greases.

EXAMPLE 18

MOK was diluted with about 3 volumes water and tested to determine its cleaning properties. It functioned essentially like MOK in our tests, but we are concerned that the water will make the aqueous solvent unsuitable for cleaning substrates, such as aluminum, that are highly susceptable to corrosion damage.

Similar solvents made by diluting MOK II (i.e. ethylene carbonate/propylene carbonate/ethylene diacetate) were also effective cleaners. We believe that any of the aprotic (organic) solvents we have described can be diluted with water, if desired, and still retain considerable cleaning power for many household and industrial cleaning applications. The added water affects the strength of the cleaner.

Additives such as acetic acid or water introduce replaceable hydrogens to the solvent, thereby altering its aprotic character. Accordingly, these additives are not preferred for universal applications, but are contemplated as desirable for specific cleaning problems where corrosion is less of a concern. We usually prefer to minimize the amount of these protic additives even when they are added to solve a particular cleaning problem. In many circumstances it is unimportant whether the solvent is aprotic. For those circumstances, nevertheless, where corrosion is an important concern, the preferred diacetate/carbonate solvent and, optionally, that with either or both of TEA and NMP is a powerful, safe nonhazardous, nontoxic, and effective cleaner with widespread applicability. Although the alcoholic -OH is not preferred, it is aprotic and compounds that include it, like TEA or the glycols, can be used without significantly increasing the corrosiveness of the solvent. These alcohols, however, may alter the toxicity of the solvent.

Various changes, substitutions, or alterations of the described embodiments might be made without departing from the broad, inventive concepts that are disclosed. The examples are provided to illustrate the invention and are not intended to limit it. The claims should be construed broadly in light of the description to include all described embodiments and their equivalents and should only be limited as required by the relevant prior art.

I claim:

1. A solvent comprising:
   (a) a mixture of an effective amount of ethylene carbonate and propylene carbonate, the mixture containing essentially equal volumetric amounts of the two carbonates;
   (b) an effective amount of at least one aprotic polar compound selected from the group consisting of alkyl diesters, alkyl diethers, alkyl compounds containing both ester and ether groups, and mixtures thereof, the polar compound being in essentially equal volumetric amount to the mixture of carbonates;
   optionally, triethanolamine;
   optionally, N-methyl-2-pyrrolidone; and
   optionally, a nonionic wetting agent of the formula:

$$C_9H_{19}-\phi(CH_2-CH_2)_{12}OH.$$

2. The solvent of claim 1 wherein the polar compound includes ethylene diacetate.

3. The solvent of claim 2 further comprising an effective amount of water.

4. The solvent of claim 1 further comprising an effective amount of propylene glycol.

5. The solvent of claim 1 wherein the polar compound is selected from the group consisting of ethylene diacetate, ethylene dibutyrate, and mixtures thereof.

6. The solvent of claim 1 further comprising an effective amount of at least one surfactant.

7. A solvent comprising about 5-10 vol % triethanolamine, about 5-10 vol % N-methyl-2-pyrrolidone, about 5-10% vol % nonionic wetting agent, and the remainder about a 50:50 vol % mixture of ethylene carbonate and ethylene diacetate.

8. The solvent of claim 8 further comprising ethylene dibutyrate.

9. A method for removing debris from a substrate comprising the step of contacting the debris with an effective amount of the solvent of claim 1.

10. A method of claim 9 wherein the debris is photoresist.

11. The method of claim 10 wherein the step of contacting includes immersing the part in the solvent.

12. The method of claim 11 further comprising the step of agitating the solvent and part during the immersion.

13. The method of claim 12 further comprising the step of heating the solvent.

14. The method of claim 13 wherein the steps of agitating and heating are achieved by inputting ultrasonic energy to the solvent.

15. The method of claim 9 wherein the debris is fingernail enamel.

16. The method of claim 9 wherein the debris is grease.

17. The solvent of claim 1 further comprising a lipophilic additive.

18. A solvent consisting essentially of a mixture of an effective amount of ethylene carbonate, about the same volume of propylene carbonate, and the remainder ethylene diacetate.

19. The solvent of claim 18 further comprising TEA added to the mixture.

20. The solvent of claim 18 further comprising NMP added to the mixture.

21. The solvent of claim 18 wherein the mixture is diluted with water.

22. The solvent of claim 18 further comprising a nonionic wetting agent.

23. The solvent of claim 19 further comprising NMP.

24. A method of cleaning debris from a substrate comprising the step of contacting the debris with the solvent of claim 18.

25. A solvent comprising at least about 35 vol. % of ethylene carbonate, a substantially equal volume of ethylene diacetate, and minor amounts of a nonionic wetting agent and ethylene dibutyrate.

26. The solvent of claim 25 further comprising sufficient water to make water about 75-90 vol. % of the resulting mixture.

27. The solvent of claim 25 further comprising about 5-10 vol % TEA based upon the initial volume of ethylene carbonate and ethylene diacetate.

28. The solvent of claim 25 further comprising about 5-10 vol. % NMP based upon the initial volume of ethylene carbonate and ethylene diacetate.

29. The solvent of claim 25 further comprising about 5-10 vol. % TEA and about 5-10 vol. % NMP, both based upon the initial volume of ethylene carbonate and ethylene diacetate.

30. A solvent comprising an effective amount of about a 50:50 volumetric mixture of ethylene carbonate and propylene carbonate, substantially an equal volume of ethylene and diacetate based upon the volume of carbonates, about 10 vol. % of a nonionic wetting agent, and about 20 vol. % ethylene dibutyrate.

31. The solvent of claim 30 further comprising about 3-9 volumes of water based on the total volume of the carbonates, diacetate, wetting agent, and dibutyrate.

32. The solvent of claim 31 further comprising about 5-10 vol. % TEA based upon the initial volume of the carbonates and diacetate.

33. The solvent of claim 31 further comprising about 5-10 vol. % NMP based upon the initial volume of the carbonates and diacetate.

34. The solvent of claim 31 further comprising about 5-10 vol. % TEA and about 5-10 vol. % NMP, both based upon the initial volume of the carbonates and diacetate.

35. A solvent comprising about 5-10 vol. % TEA and the remainder about a 50:50 vol. % mixture of alkylene carbonate and ethylene dialkylate.

36. The solvent of claim 35 wherein the alkylene carbonate is selected from the group consisting of ethylene carbonate, propylene carbonate, or about a 50:50 vol. % mixture of ethylene carbonate and propylene carbonate.

37. A solvent comprising about 5-10 vol. % NMP and the remainder about 50:50 vol. % mixture of alkylene carbonate and ethylene dialkylate.

38. The solvent of claim 37 wherein the alkylene carbonate is selected from the group consisting of ethylene carbonate propylene carbonate, or about a 50:50 vol. % mixture of ethylene carbonate and propylene carbonate.

39. The solvent of claim 36 wherein the ethylene dialkylate is selected from the group consisting of ethylene diacetate, ethylene dibutyrate, or mixtures of ethylene diacetate and ethylene dibutyrate.

40. The solvent of claim 35 further comprising about 3-9 volumes of water based upon the combined volume of carbonate, dialkylate, and TEA.

41. The solvent of claim 37 further comprising about 3-9 volumes of water based upon the combined volume of carbonate, dialkylate, and NMP.

42. A solvent comprising:
(a) about 35 vol. % of a carbonate selected from the group consisting of ethylene carbonate or about a 50:50 vol. % mixture of ethylene carbonate and propylene carbonate;
(b) about 35 vol. % ethylene diacetate;
(c) about 10 vol. % nonionic wetting agent;
(d) about 20 vol. % ethylene dibutyrate;
(e) optionally about 5-10 vol. % TEA;
(f) optionally about 5-10 vol. % NMP; and
(g) optionally 3-9 volumes of water based upon the combined volumes of the other components.

* * * * *